(12) United States Patent
Sharma

(10) Patent No.: US 8,319,095 B2
(45) Date of Patent: Nov. 27, 2012

(54) METHOD OF MAKING AN ANTIREFLECTIVE SILICA COATING, RESULTING PRODUCT, AND PHOTOVOLTAIC DEVICE COMPRISING SAME

(75) Inventor: Pramod K. Sharma, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1032 days.

(21) Appl. No.: 11/987,129

(22) Filed: Nov. 27, 2007

(65) Prior Publication Data

US 2009/0133748 A1    May 28, 2009

(51) Int. Cl.
*H01L 31/00* (2006.01)
*B05D 5/12* (2006.01)

(52) U.S. Cl. .......................... 136/256; 427/74
(58) Field of Classification Search ................. 136/256; 427/74
See application file for complete search history.

(56) References Cited

U.S. PATENT DOCUMENTS

| | | | |
|---|---|---|---|
| 4,510,344 A | 4/1985 | Berman | |
| 4,806,436 A | 2/1989 | Tada et al. | |
| 4,816,333 A | 3/1989 | Lange et al. | |
| 4,830,879 A | 5/1989 | Debsikdar | |
| 5,401,287 A | 3/1995 | Pecoraro et al. | |
| 5,750,797 A * | 5/1998 | Vitcak et al. | 568/683 |
| 5,883,030 A | 3/1999 | Bako et al. | |
| 5,948,131 A | 9/1999 | Neuman | |
| 5,977,477 A | 11/1999 | Shiozaki | |
| 6,362,121 B1 * | 3/2002 | Chopin et al. | 502/2 |
| 6,495,482 B1 | 12/2002 | de Sandro et al. | |
| 6,503,860 B1 | 1/2003 | Dickinson et al. | |
| 6,506,622 B1 | 1/2003 | Shiozaki | |
| 6,538,084 B2 * | 3/2003 | Kitahara et al. | 526/250 |
| 6,776,007 B2 | 8/2004 | Hirota et al. | |
| 6,846,760 B2 | 1/2005 | Siebers et al. | |
| 2002/0090519 A1 | 7/2002 | Kursawe et al. | |
| 2004/0028918 A1 | 2/2004 | Becker et al. | |
| 2004/0058079 A1 | 3/2004 | Yamada et al. | |
| 2004/0248995 A1 | 12/2004 | Glaubitt et al. | |

(Continued)

FOREIGN PATENT DOCUMENTS

| | | |
|---|---|---|
| EP | 1 329 433 | 7/2003 |
| JP | 11-60269 | 3/1999 |
| WO | WO0216517 | * 2/2002 |

OTHER PUBLICATIONS

Handbook of Science and Photovoltaic Engineering, 2003, John Wiley & Sons, Ltd., ISBN 0-471-49196-9, p. 62.*

(Continued)

*Primary Examiner* — Mark F Huff
*Assistant Examiner* — Tamir Ayad
(74) *Attorney, Agent, or Firm* — Nixon & Vanderhye P.C.

(57) ABSTRACT

A low-index silica coating may be made by forming silica sol comprising a silane and/or a colloidal silica. The silica precursor may be deposited on a substrate (e.g., glass substrate) to form a coating layer. The coating layer may then be cured and/or fired using temperature(s) of from about 550 to 700° C. A capping layer composition comprising an antifog composition including a siloxane and/or hydrofluororether may be formed, deposited on the coating layer, then cured and/or fired to form a capping layer The capping layer improves the durability of the coating. The low-index silica based coating may be used as an antireflective (AR) film on a front glass substrate of a photovoltaic device (e.g., solar cell) or any other suitable application in certain example instances.

16 Claims, 1 Drawing Sheet

U.S. PATENT DOCUMENTS

2004/0258929 A1    12/2004   Glaubitt et al.
2005/0195486 A1*   9/2005    Sasaki et al. .................. 359/580

OTHER PUBLICATIONS

U.S. Appl. No. 11/122,218, filed May 5, 2005.
U.S. Appl. No. 11/049,292, filed Feb. 3, 2005.
CEI/IEC 61215 (Apr. 2005).
"Photovoltaic Module Performance and Durability Following Long-Term Field Exposure", King et al., Sandia National Laboratories, (19pgs).
"Antireflection of Glazings for Solar Energy Applications", Nostell et al., Solar Energy Materials and Solar Cells 54 (1988) pp. 223-233.
"Anti-reflection (AR) Coatings Made by Sol-Gel Process: A Review", Chen, Solar Energy Materials and Solar Cells 68 (2001) pp. 313-336.
"Silica Antireflective Films on Glass Produced by the Sol-Gel Method", Bautista et al., Solar Energy Materials and Solar Cells 80 (2003) pp. 217-225.
U.S. Appl. No. 11/701,541, filed Feb. 2, 2007.
U.S. Appl. No. 11/790,813, filed Apr. 27, 2007.

* cited by examiner

METHOD OF MAKING AN ANTIREFLECTIVE SILICA COATING, RESULTING PRODUCT, AND PHOTOVOLTAIC DEVICE COMPRISING SAME

Certain example embodiments of this invention relate to a method of making a low-index silica coating having an overcoat or capping layer. In certain example embodiments, the coating may comprise an antireflective (AR) coating supported by a glass substrate for use in a photovoltaic device or the like in certain example embodiments. The capping or overcoat layer may include siloxane(s) and/or hydrofluoroether(s).

BACKGROUND OF THE INVENTION

Glass is desirable for numerous properties and applications, including optical clarity and overall visual appearance. For some example applications, certain optical properties (e.g., light transmission, reflection and/or absorption) are desired to be optimized. For example, in certain example instances, reduction of light reflection from the surface of a glass substrate may be desirable for storefront windows, display cases, photovoltaic devices (e.g., solar cells), picture frames, other types of windows, greenhouses, and so forth.

Photovoltaic devices such as solar cells (and modules therefor) are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be of glass, and the photoelectric transfer film (typically semiconductor) is for converting solar energy to electricity. Example solar cells are disclosed in U.S. Pat. Nos. 4,510,344, 4,806,436, 6,506,622, and 5,977,477, the disclosures of which are hereby incorporated herein by reference.

Substrate(s) in a solar cell/module are sometimes made of glass. Incoming radiation passes through the incident glass substrate of the solar cell before reaching the active layer(s) (e.g., photoelectric transfer film such as a semiconductor) of the solar cell. Radiation that is reflected by the incident glass substrate does not make its way into the active layer(s) of the solar cell, thereby resulting in a less efficient solar cell. In other words, it would be desirable to decrease the amount of radiation that is reflected by the incident substrate, thereby increasing the amount of radiation that makes its way to the active layer(s) of the solar cell. In particular, the power output of a solar cell or photovoltaic (PV) module may be dependant upon the amount of light, or number of photons, within a specific range of the solar spectrum that pass through the incident glass substrate and reach the photovoltaic semiconductor.

Because the power output of the module may depend upon the amount of light within the solar spectrum that passes through the glass and reaches the PV semiconductor, certain attempts have been made in an attempt to boost overall solar transmission through the glass used in PV modules. One attempt is the use of iron-free or "clear" glass, which may increase the amount of solar light transmission when compared to regular float glass, through absorption minimization.

Another attempt to boost overall solar transmission involves the use of porous silica as an antireflective coating on glass substrate. But the environmental durability of AR coatings derived from porous silica may be an issue if the coating is cast on the glass substrate at high humidity and/or temperature. When water contacts glass, an ion exchange process may begin, in which sodium ions in the glass are displaced by hydrogen ions from the water. The immediate outcome can be the hydration, or dealkalization, of the glass and depletion of the hydrogen ions from the water. This process can be accompanied by a shift in the aqueous equilibrium to produce more $H^+$ and $OH^-$ ions (i.e., $H_2O \rightarrow H^+ + OH^-$).

This ion exchange process may be temperature and humidity dependent. If this process occurs over a sufficiently long period of time, there may be degradation in the surface quality due to alkali attack on the glass silicate network. This degradation may manifest itself in one or more forms, such as: (1) A distinctive milky white haze, which may be seen in all the glass (with or without a coating) after reaction in high humidity and/or freezing conditions; and/or (2) Microscopic pitting of glass occurs, wherein the pits may develop into tiny crevices that grow and eventually undercut the surface, forming islands of glass which can exfoliate from the underlying bulk material.

These defects may lead to a reduction in transmissivity of an antireflecting coating after the high humidity and temperature variation. Therefore, there may be a need to minimize the reduction in transmission to maintain the performance of the antireflecting coatings in the environmental conditions such as high humidity and temperature conditions.

In one aspect of the present invention, there is a capping layer on antireflecting coatings that may minimizes the direct contact of water to the coating and substrate. It may lead to an environmentally durable AR coating. Accordingly, in one embodiment, this invention relates to use of a capping layer, such as, an antifog coating on a temperable AR coating on glass substrate, and possibly a minimization of reduction in transmittance after the exposure of high humidity and temperature conditions (such as, for example, thermal and dampness/wetness testing).

BRIEF SUMMARY OF EXAMPLE EMBODIMENTS OF THE INVENTION

In certain example embodiments of this invention, there is provided a method of making a low-index silica based coating, the method comprising: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer; wherein the capping layer composition comprises an antifog composition including a hydrofluoroether and curing and/or firing the surface treatment composition to form a capping layer. The method may result in a coating having improved durability after exposure to high humidity and high temperature and/or low humidity and low temperature when compared to a coating not including the capping layer.

In certain embodiments, deposition may occur using at least one of the following: flow-coating, spin-coating, roller-coating, and spray-coating. In preferred embodiments, the antifog composition comprises a siloxane. In other preferred embodiments, the antifog composition comprises a hydrofluoroether and may corresponds to the formula $R_f(OR_h)_n$, wherein $R_f$ is a perfluorinated alkyl group, wherein $R_h$ is an alkyl group, and n is a number ranging from 1 to 3, and wherein a number of carbon atoms contained in $R_f$ is greater than a total number of carbon atoms contained in all $R_h$ groups. In certain embodiments, $R_f$ comprises between 2 and 8 carbon atoms and is a linear or branched perfluoroalkyl group.

In certain embodiments, there is a method of making a photovoltaic device comprising a photoelectric transfer film, at least one electrode, and the low-index coating, wherein the method of making the photovoltaic device comprises making a low-index coating comprising a capping layer including a siloxane and/or hydrofluoroether, and wherein the low-index coating is provided on a light incident side of a front glass substrate of the photovoltaic device.

In certain embodiments, there is a method of making a photovoltaic device including a low-index silica based coating used in an antireflective coating, the method comprising: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer; wherein the capping layer composition comprises an antifog composition including a siloxane and/or hydrofluoroether; curing and/or firing the surface treatment composition to form a capping layer; the method resulting in a coating having improved durability after exposure to high humidity and high temperature and/or low humidity and low temperature when compared to a coating not including the capping layer; using the glass substrate with the low-index silica based coating thereon as a front glass substrate of the photovoltaic device so that the low-index silica based coating is provided on a light incident side of the glass substrate.

In certain embodiments, there is a photovoltaic device comprising: a photovoltaic film, and at least a glass substrate on a light incident side of the photovoltaic film; an antireflection coating provided on the glass substrate; wherein the antireflection coating comprises at least a layer provided directly on and contacting the glass substrate, the layer produced using a method comprising the steps of: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer, wherein the capping layer composition comprises an antifog composition including a hydrofluoroether; curing and/or firing the surface treatment composition to form a capping layer; wherein the layer has an improved durability after exposure to high humidity and high temperature and/or low humidity and low temperature when compared to a layer not including the capping layer.

In certain embodiments, there is a coated article comprising: a glass substrate; an antireflection coating provided on the glass substrate; wherein the antireflection coating comprises at least a layer provided directly on and contacting the glass substrate, the layer produced using a method comprising the steps of: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer, wherein the capping layer composition comprises an antifog composition including a siloxane and/or hydrofluoroether; curing and/or firing the surface treatment composition to form a capping layer; wherein the layer has an improved durability after exposure to high humidity and high temperature and/or low humidity and low temperature when compared to a layer not including the capping layer.

In certain embodiments, deposition may occur using at least one of the following: flow-coating, spin-coating, roller-coating, and spray-coating.

In certain embodiments, the antifog composition comprises a siloxane. Suitable siloxanes may, for example, include hexaethylcyclotrisiloxane, hexaethyl disiloxane, 1,1,3,3,5,5-hexamethyltrisiloxane, hexamethylcyclotrisiloxane, hexavinyldisiloxane, hexaphenyldisiloxane, octaphenylcyclotetrasiloxane, hexachlorodisiloxane, dichlorooctamethyltetrasiloxane, 2-methoxy(polyethyleneoxy)propyl) heptamethyl trisiloxane, 3 acryloxypropyl tris trimethyl siloxysilane, methylacryloxypropyl heptacyclopentyl-T8silsesquioxane, octakis(dimethylsiloxy)octaprismosilsesquioxane, and octaviny-T8-silsesquioxane.

In certain embodiments, the antifog composition comprises a hydrofluoroether and may corresponds to the formula $R_f(OR_h)_n$, wherein $R_f$ is a perfluorinated alkyl group, wherein $R_h$ is an alkyl group, and n is a number ranging from 1 to 3, and wherein a number of carbon atoms contained in $R_f$ is greater than a total number of carbon atoms contained in all $R_h$ groups. In certain embodiments, $R_f$ comprises between 2 and 8 carbon atoms and is a linear or branched perfluoroalkyl group.

DETAILED DESCRIPTION OF EXEMPLARY EMBODIMENTS OF THE INVENTION

Figure 1:
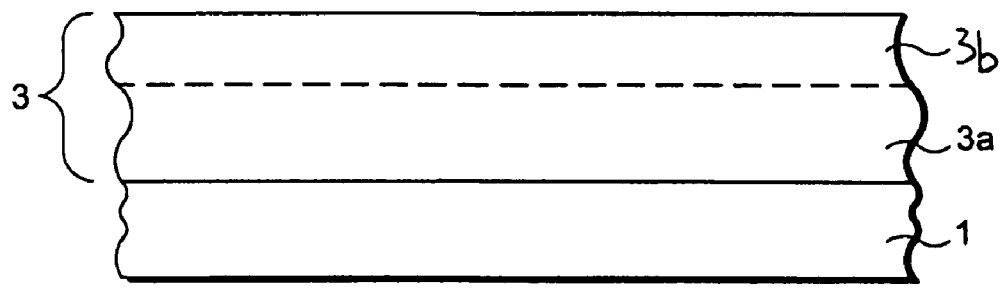
FIG. 1 is a cross sectional view of a coated article including an antireflective (AR) coating made in accordance with an example embodiment of this invention (this coated article of FIG. 1 may be used in connection with a photovoltaic device or in any other suitable application in different embodiments of this invention).

Referring now more particularly to the accompanying drawings in which like reference numerals indicate like parts throughout the several views.

This invention relates to antireflective (AR) coatings that may be provided for in coated articles used in devices such as photovoltaic devices, storefront windows, display cases, picture frames, greenhouses, other types of windows, and the like. In certain example embodiments (e.g., in photovoltaic devices), the AR coating may be provided on either the light incident side or the other side of a substrate (e.g., glass substrate), such as a front glass substrate of a photovoltaic device. In other example embodiments, the AR coatings described herein may be used in the context of sport and stadium lighting (as an AR coating on such lights), and/or street and highway lighting (as an AR coating on such lights).

In certain example embodiments of this invention, an improved anti-reflection (AR) coating is provided on an incident glass substrate of a solar cell or the like. This AR coating may function to reduce reflection of light from the glass substrate, thereby allowing more light within the solar spectrum to pass through the incident glass substrate and reach the photovoltaic semiconductor so that the solar cell can be more efficient. In other example embodiments of this invention, such an AR coating is used in applications other than photovoltaic devices (e.g., solar cells), such as in storefront windows, display cases, picture frames, greenhouse glass/windows, solariums, other types of windows, and the like. The glass substrate may be a glass superstrate or any other type of glass substrate in different instances.

FIG. 1 is a cross sectional view of a coated article according to an example embodiment of this invention. The coated article of FIG. 1 includes a glass substrate 1 and an AR coating 3. The AR coating includes a first layer 3a and an overcoat layer 3b.

In the FIG. 1 embodiment, the antireflective coating 3 includes first layer 3a comprising a silane and/or a colloidal silica. The first layer 3a may be any suitable thickness in certain example embodiments of this invention. However, in certain example embodiments, the first layer 3a of the AR coating 3 has a thickness of approximately 500 to 4000 Å after firing.

The AR coating 3 also includes a capping layer 3b of or including siloxane(s) and/or hydrofluoroether(s), which is provided over the first layer 3a in certain example embodiments of this invention as shown in FIG. 1. It is possible to form other layer(s) between layers 3a and 3b, and/or between glass substrate 1 and layer 3a, in different example embodiments of this invention.

In certain example embodiments of this invention, high transmission low-iron glass may be used for glass substrate 1 in order to further increase the transmission of radiation (e.g., photons) to the active layer of the solar cell or the like. For example and without limitation, the glass substrate 1 may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of anti-reflective coatings produced in accordance with the present invention may increase transmission of light to the active semiconductor film of the photovoltaic device.

Certain glasses for glass substrate 1 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 1 below (in terms of weight percentage of the total glass composition):

TABLE 1

Example Additional Materials In Glass

| Ingredient | General (Wt. %) | More Preferred | Most Preferred |
| --- | --- | --- | --- |
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the glass substrate 1 may be flat or patterned in different example embodiments of this invention.

Figure 2:
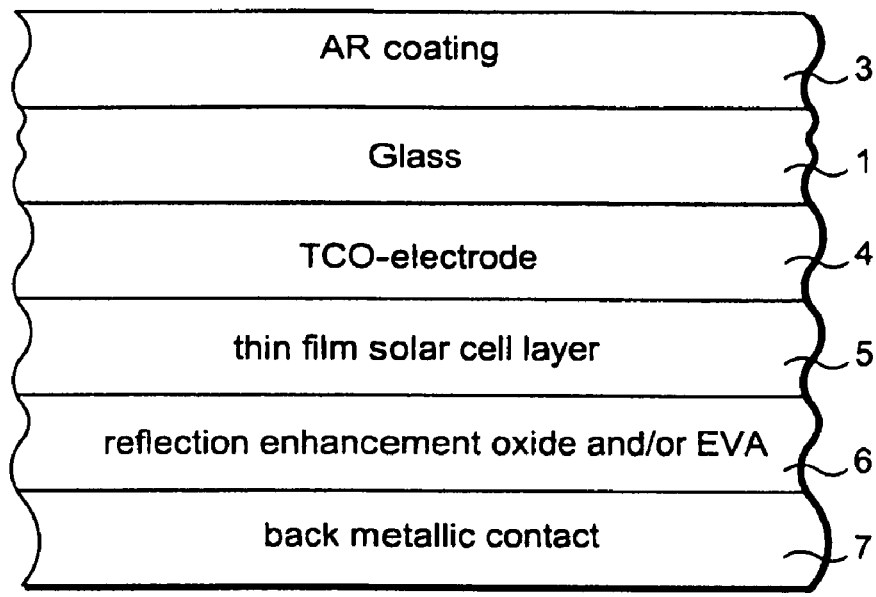
FIG. 2 is a cross sectional view of a photovoltaic device that may use the AR coating of FIG. 1.

FIG. 2 is a cross-sectional view of a photovoltaic device (e.g., solar cell), for converting light to electricity, according to an example embodiment of this invention. The solar cell of FIG. 2 uses the AR coating 3 and glass substrate 1 shown in FIG. 1 in certain example embodiments of this invention. In this example embodiment, the incoming or incident light from the sun or the like is first incident on capping layer 3*b* of the AR coating 3, passes therethrough and then through layer 3*a* and through glass substrate 1 and front transparent electrode 4 before reaching the photovoltaic semiconductor (active film) 5 of the solar cell. Note that the solar cell may also include, but does not require, a reflection enhancement oxide and/or EVA film 6, and/or a back metallic contact and/or reflector 7 as shown in example FIG. 2. Other types of photovoltaic devices may of course be used, and the FIG. 2 device is merely provided for purposes of example and understanding. As explained above, the AR coating 3 reduces reflections of the incident light and permits more light to reach the thin film semiconductor film 5 of the photovoltaic device thereby permitting the device to act more efficiently.

While certain of the AR coatings 3 discussed above are used in the context of the photovoltaic devices/modules, this invention is not so limited. AR coatings according to this invention may be used in other applications such as for picture frames, fireplace doors, greenhouses, and the like. Also, other layer(s) may be provided on the glass substrate under the AR coating so that the AR coating is considered on the glass substrate even if other layers are provided therebetween. Also, while the first layer 3*a* is directly on and contacting the glass substrate 1 in the FIG. 1 embodiment, it is possible to provide other layer(s) between the glass substrate and the first layer in alternative embodiments of this invention.

Long chain organic materials having reactive end groups based on silicon and phosphorous may form self-assembled monolayers on glass surfaces. Silanes containing short organic chains such as methyl trichlorosilane may be used to produce monolayers of coatings (e.g., first layer 3*a*) on glass surface.

Dilute solutions or dispersions of coating materials in aqueous or non-aqueous media may be applied by any conventional wet application techniques. A preferred method involves application of a dilute coating formulation by spray process on the AR coating surface immediately after the coated glass emerges from a tubular furnace such as tempering line, etc. Concentration of spray coating formulation and the dwell time of the wet coating on the AR coating surface may be varied to get maximum packing density of monolayers. In addition thermal energy may be applied to further enhance coating process.

Exemplary embodiments of this invention provide a new method to produce a low index silica coating for use as the AR coating 3, with appropriate light transmission properties. Exemplary embodiments of this invention provide a method of making a coating containing a stabilized colloidal silica for use in coating 3. In certain example embodiments of this invention, the coating may be based, at least in part, on a silica sol comprising two different silica precursors, namely (a) a stabilized colloidal silica including or consisting essentially of particulate silica in a solvent and (b) a polymeric solution including or consisting essentially of silica chains.

In accordance with certain embodiments of the present invention, suitable solvents may include, for example, n-propanol, isopropanol, other well-known alcohols (e.g., ethanol), and other well-known organic solvents (e.g., toluene).

In exemplary embodiments, silica precursor materials may be optionally combined with solvents, anti-foaming agents, surfactants, etc., to adjust rheological characteristics and other properties as desired. In a preferred embodiment, use of reactive diluents may be used to produce formulations containing no volatile organic matter. Some embodiments may comprise colloidal silica dispersed in monomers or organic solvents. Depending on the particular embodiment, the weight ratio of colloidal silica and other silica precursor materials may be varied. Similarly (and depending on the embodiment), the weight percentage of solids in the coating formulation may be varied.

Several examples were prepared, so as to illustrate exemplary embodiments of the present invention. Although the examples describe the use of the spin-coating method, the uncured coating may be deposited in any suitable manner, including, for example, not only by spin-coating but also roller-coating, spray-coating, and any other method of depositing the uncured coating on a substrate.

In certain exemplary embodiments, the firing may occur in an oven at a temperature ranging preferably from 550 to 700° C. (and all subranges therebetween), more preferably from 575 to 675° C. (and all subranges therebetween), and even more preferably from 600 to 650° C. (and all subranges therebetween). The firing may occur for a suitable length of time, such as between 1 and 10 minutes (and all subranges therebetween) or between 3 and 7 minutes (and all subranges therebetween).

In certain exemplary embodiments, the capping layer composition comprises siloxane(s) and/or hydrofluoroether(s). Suitable siloxanes may, for example, include hexaethylcyclotrisiloxane, hexaethyl disiloxane, 1,1,3,3,5,5-hexamethyltrisiloxane, hexamethylcyclotrisiloxane, hexavinyldisiloxane, hexaphenyldisiloxane, octaphenylcyclotetrasiloxane, hexachlorodisiloxane, dichlorooctamethyltetrasiloxane, 2-methoxy(polyethyleneoxy)propyl) heptamethyl trisiloxane, 3 acryloxypropyl tris trimethyl siloxysilane, methylacryloxypropyl heptacyclopentyl-T8silsesquioxane, octakis (dimethylsiloxy)octaprismosilsesquioxane, and octaviny-T8-silsesquioxane.

The hydrofluoroether may correspond to the following general formula: $R_f(OR_h)_n$, where $R_f$ is a perfluorinated alkyl group; $R_h$ is an alkyl group; and n is a number ranging from 1 to 3; and where the number of carbon atoms contained in $R_f$ is greater than the total number of carbon atoms contained in all $R_h$ groups. In certain preferred embodiments, $R_f$ comprises between 2 and 8 carbon atoms and is selected from the group consisting of a linear or branched perfluoroalkyl group (such as, for example, described in PCT Pub. No. WO/1999/019707, the entirety of which is incorporated herein by reference).

In certain embodiments that include a siloxane, it may be beneficial to use a primer layer prior to application and formation of the capping layer. The primer layer may promote adhesion of the capping layer to the coating. Suitable primer layers include layers comprising alcohols, such as isopropanol, ethanol, and isobutyl alcohol, and/or well-known solvent(s).

In some embodiments, the resulting capping layer may vary from 2 μm to 50 μm, and all subranges therebetween.

Set forth below is a description of how AR coating 3 may be made according to certain example non-limiting embodiments of this invention.

Example #1

The silica sol was prepared as follows. A polymeric component of silica was prepared by using 64% wt of n-propanol (available from Chem Central), 24% wt of glycydoxylpropyltrimethoxysilane (glymo) (available from Gelest, Inc.), 7% wt of water and 5% wt of hydrochloric acid (available from VWR International). These ingredients were used and mixed for 24 hrs. The coating solution was prepared by using 21% wt of polymeric solution, 7% wt colloidal silica in methyl ethyl ketone supplied by Nissan Chemicals Inc, and 72% wt n-propanol. This was stirred for 2 hrs to give silica sol. The final solution is referred to as a silica sol. The silica coating was fabricated using the spin coating method with 1000 rpm for 18 secs. The coating was heat treated in furnace at 625° C. for three and a half minutes. This coating does not have any barrier layer. The environmental durability of the coating was done under following conditions for high humidity and freezing.

Ramp—Heat from room temperature (25° C.) to 85° C.@100 C/hr;
Bring RH up to 85%.
Cycle 1—Dwell@85° C./85% RH for 1200 minutes.
Ramp—Cool from 85° C. to −40° C.@ 10° C./hr; Bring RH down to 0%.
Cycle 2—Dwell@−40° C./0% RH for 40 minutes.
Ramp—Heat from −40° C. to 85° C.@100 C/hr; Bring the RH up to 85%.
Repeat—Repeat for 10 cycles or 240 hrs.

The transmission measurements were done using PerkinElmer UV-VIS Lambda 950 before and after the environmental testing. The change in % T after testing is shown in the Table 2, i.e., 13.39.

Example #2

In Example #2, a bottom layer was made as mentioned in Example #1 and then followed the heat treatment. After cooling down to room temperature, a primer layer based on isopropyl alcohol and isobutyl alcohol (commercially available as SP-22 from Exxene Corporation) was applied on the AR coating by flow method. The coating was dried at 120° C. for 5 minutes. The coating was cooled down to room temperature. Then antifog coating based on modified siloxane in organic solvent (diacetone alcohol) (commercially available Exxene HCAF-424 antifog solution) was fabricated using flow coating method. The coating was dried at 125° C. for 5 minutes. The coatings were subjected to the environmental testing as illustrated in the Example #1. Transmission was measured before and after the environmental testing and result shown in Table 2. The change in % T after testing is 3.65.

Example #3

Example #3 is same as Example #2 except the antifog coatings are based on a hydrofluoroether (FogTech supplied by MotoSolutions, CA). The antifog coating was applied by flow coating method and dried at room temperature. The coatings were subjected to the environmental testing as illustrated in the Example #1. Transmission was measured before and after the environmental testing and result is shown in Table 2. The change in % T after testing is 0.45.

Example #4

Example #4 is the same as Example #1 except the coating was exposed to thermal cycle (−40 to +85 C) with condensation minimization and air circulation for 20 days per IEC 61215, which is incorporated herein by reference. Transmission was measured before and after the environmental testing and the result is shown in Table 2. The change in % T after testing is 1.31.

Example #5

Example #5 is the same as Example #2 except the antifog coating was exposed to thermal cycle (−40 to +85 C) with condensation minimization and air circulation for 20 days per IEC 61215. Transmission was measured before and after the environmental testing and result shown in Table 2. The change in % T after testing is 0.70.

Example #6

Example #6 is the same as Example #3 except the antifog coating was exposed to thermal cycle (−40 to +85 C) with condensation minimization and air circulation for 20 days per IEC 61215. Transmission was measured before and after the environmental testing and result shown in Table 2. The change in % T after testing is 0.03.

Example #7

Example #7 is the same as Example #1 except the coating was exposed to damp testing (85 C and 85% RH) for 40 days per IEC61215. Transmission was measured before and after the environmental testing and the result is shown in Table 2. The change in % T after testing is 3.06.

Example #8

Example #8 is the same as Example #2 except the antifog coating was exposed to damp testing (85 C and 85% RH) for 40 days per IEC61215. Transmission was measured before and after the environmental testing and the result is shown in Table 2. The change in % T after testing is 1.78.

Example #9

Example #9 is the same as Example #3 except the antifog coating was exposed to damp testing (85 C and 85% RH) for 40 days per IEC61215. Transmission was measured before and after the environmental testing and the result is shown in Table 2. The change in % T after testing is 0.27.

TABLE 2

Transmission of AR coatings with and without capping layer before and after high humidity and freeze testing.

| Example | % Transmission | | |
|---|---|---|---|
| | Before Testing | After Testing | Change |
| Example #1 | 86.96 | 73.57 | 13.39 |
| Example #2 | 84.54 | 80.89 | 3.65 |
| Example #3 | 85.25 | 84.80 | 0.45 |
| Example #4 | 86.96 | 85.65 | 1.31 |
| Example #5 | 86.67 | 85.97 | 0.70 |
| Example #6 | 85.04 | 85.01 | 0.03 |
| Example #7 | 86.98 | 83.12 | 3.86 |
| Example #8 | 84.68 | 82.91 | 1.78 |
| Example #9 | 84.96 | 84.69 | 0.27 |

As shown in these exemplary embodiments, the durability of temperable antireflecting coatings can be enhanced for high humidity and freeze conditions using an antifog coating as a capping layer. For instance, the change in % T after high humidity and freeze condition may become 4% if the modified siloxane based antifog is used as capping layer on AR coating in comparison to a 14% change without capping layer. For another example, the change in % T after high humidity and freeze condition may become 1.5% if the hydrofluoroether based antifog is used on AR coating in comparison to a 14% change without capping layer.

In yet another example, the durability of temperable antireflecting coatings can be enhanced for thermal testing conditions using antifog coating as capping layer. In a further example, the change in % T after thermal testing may become 0.70% if the modified siloxane based antifog is used as capping layer on AR coating in comparison to a 1.31% change without capping layer. In another example, the change in % T after thermal testing may become 0.03% if the hydrofluoroether based antifog is used on AR coating in comparison to a 1.31% change without capping layer.

In yet a further example, the durability of temperable antireflecting coatings may be enhanced for damp testing conditions using antifog coating as capping layer. In one more example, the change in % T after damp testing may become 1.78% if the modified siloxane based antifog is used as capping layer on AR coating in comparison to a 3.86% change without capping layer. In another example, the change in % T after damp testing may became 0.27% if the hydrofluoroether based antifog is used on AR coating in comparison to a 3.86% change without capping layer.

All described and claimed numerical values and ranges are approximate and include at least some degree of variation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a low-index silica based coating, the method comprising:
    forming a silica based precursor comprising a silica sol comprising a silane and/or a colloidal silica;
    depositing the silica precursor on a glass substrate to form a coating layer;
    curing and/or firing the coating layer in an oven at a temperature of from about 550 to 700° C. for a duration of from about 1 to 10 minutes;
    depositing a capping layer composition on the coating layer; wherein the capping layer composition comprises an antifog composition including a hydrofluoroether;
    curing and/or firing the surface treatment composition to form a capping layer; and
    wherein the method results in a coating having durability after exposure to high humidity and high temperature, and/or low humidity and low temperature, when compared to a coating not including the capping layer, and wherein said capping layer is the outermost layer of the coating.

2. The method of claim 1, wherein either step of depositing comprises flow-coating, spin-coating, roller-coating, or spray-coating.

3. The method of claim 1, wherein the antifog composition further comprises a siloxane.

4. The method of claim 1, wherein the antifog composition comprises a hydrofluoroether corresponding to $R_f(OR_h)_n$; wherein $R_f$ is a perfluorinated alkyl group; wherein $R_h$ is an alkyl group; and n is a number ranging from 1 to 3; and wherein a number of carbon atoms contained in $R_f$ is greater than a total number of carbon atoms contained in all $R_h$ groups.

5. The method of claim 4, wherein $R_f$ comprises between 2 and 8 carbon atoms and is a linear or branched perfluoroalkyl group.

6. A method of making a photovoltaic device comprising a photoelectric transfer film, at least one electrode, and the low-index coating, wherein the method of making the photovoltaic device comprises making the low-index coating according to claim 1, and wherein the low-index coating is provided on a light incident side of a front glass substrate of the photovoltaic device.

7. A method of making a photovoltaic device including a low-index silica based coating used in an antireflective coating, the method comprising:
    forming a silica precursor comprising a silica sol comprising a silane and/or a colloidal silica;
    depositing the silica precursor on a glass substrate to form a coating layer;
    curing and/or firing the coating layer in an oven at a temperature of from about 550 to 700° C. for a duration of from about 1 to 10 minutes;
    depositing a capping layer composition on the coating layer; wherein the capping layer composition comprises an antifog composition including a hydrofluoroether;
    curing and/or firing the surface treatment composition to form a capping layer;
    the method resulting in a coating having improved durability after exposure to high humidity and high temperature and/or low humidity and low temperature when compared to a coating not including the capping layer;
    using the glass substrate with the low-index silica based coating thereon as a front glass substrate of the photovoltaic device so that the low-index silica based coating is provided on a light incident side of the glass substrate.

8. The method of claim 7, wherein the antifog composition further comprises a siloxane.

9. The method of claim 7, wherein the antifog composition comprises a hydrofluoroether corresponding to $R_f(OR_h)_n$; wherein $R_f$ is a perfluorinated alkyl group; wherein $R_h$ is an alkyl group; and n is a number ranging from 1 to 3; and wherein a number of carbon atoms contained in $R_f$ is greater than a total number of carbon atoms contained in all $R_h$ groups.

10. The method of claim 9, wherein $R_f$ comprises between 2 and 8 carbon atoms and is a linear or branched perfluoroalkyl group.

11. A photovoltaic device comprising:
    a photovoltaic film, and at least a glass substrate on a light incident side of the photovoltaic film;
    an antireflection coating provided on the glass substrate;
    wherein the antireflection coating comprises at least a layer provided directly on and contacting the glass substrate, the layer produced using a method comprising the steps of: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer, wherein the capping layer composition comprises an antifog composition including a hydrofluoroether; curing and/or firing the surface treatment composition to form a capping layer; wherein the layer has an improved durability after exposure to high humidity and high temperature and/or low humidity and low temperature when compared to a layer not including the capping layer.

12. The photovoltaic device of claim 11, wherein the antifog composition comprises a hydrofluoroether corresponding to $R_f(OR_h)_n$; wherein $R_f$ is a perfluorinated alkyl group; wherein $R_h$ is an alkyl group; and n is a number ranging from 1 to 3; and wherein a number of carbon atoms contained in $R_f$ is greater than a total number of carbon atoms contained in all $R_h$ groups.

13. The photovoltaic device of claim 12, wherein $R_f$ comprises between 2 and 8 carbon atoms and is a linear or branched perfluoroalkyl group.

14. A coated article comprising:
a glass substrate;
an antireflection coating provided on the glass substrate; wherein the antireflection coating comprises at least a layer provided directly on and contacting the glass substrate, the layer produced using a method comprising the steps of: forming a silica precursor comprising a silica sol comprising a silane and/or a colloidal silica; depositing the silica precursor on a glass substrate to form a coating layer; curing and/or firing the coating layer in an oven at a temperature of from about 550 to 700° C. for a duration of from about 1 to 10 minutes; depositing a capping layer composition on the coating layer, wherein the capping layer composition comprises an antifog composition including a hydrofluoroether; curing and/or firing the surface treatment composition to form a capping layer; wherein the layer has an improved durability after exposure to high humidity and high temperature and/or low humidity and low temperature when compared to a layer not including the capping layer.

15. The coated article of claim 14, wherein the antifog composition comprises a hydrofluoroether corresponding to $R_f(OR_h)_n$; wherein $R_f$ is a perfluorinated alkyl group; wherein $R_h$ is an alkyl group; and n is a number ranging from 1 to 3; and wherein a number of carbon atoms contained in $R_f$ is greater than a total number of carbon atoms contained in all $R_h$ groups.

16. The coated article of claim 14, wherein $R_f$ comprises between 2 and 8 carbon atoms and is a linear or branched perfluoroalkyl group.

* * * * *